US006589668B1

(12) United States Patent
Braithwaite et al.

(10) Patent No.: US 6,589,668 B1
(45) Date of Patent: Jul. 8, 2003

(54) GRADED PLATINUM DIFFUSION ALUMINIDE COATING

(75) Inventors: Dwayne A. Braithwaite, Wallingford, CT (US); Vincent J. Russo, Derby, CT (US); Lloyd W. Cannon, Durham, CT (US); Thomas P. Slavin, Rocky Hill, CT (US)

(73) Assignee: Howmet Research Corporation, Whitehall, MI (US)

( * ) Notice: Subject to any disclaimer, the term of this patent is extended or adjusted under 35 U.S.C. 154(b) by 0 days.

(21) Appl. No.: 09/598,088

(22) Filed: Jun. 21, 2000

(51) Int. Cl.[7] ............................ B32B 15/00; F03B 3/12; C23C 16/06

(52) U.S. Cl. ....................... 428/610; 428/650; 428/670; 428/680; 427/252; 427/253; 416/241 R

(58) Field of Search ................................ 427/252, 253; 428/670, 650, 621, 628, 610, 680; 416/241 R

(56) References Cited

U.S. PATENT DOCUMENTS 4,132,816 A 1/1979 Benden et al.
4,148,275 A 4/1979 Benden et al.
4,501,776 A * 2/1985 Shankar
5,057,196 A 10/1991 Creech et al.
5,071,678 A * 12/1991 Grybowski et al.
5,292,594 A 3/1994 Liburdi et al.
5,650,235 A 7/1997 McMordie et al.
5,658,614 A 8/1997 Basta et al.
5,688,607 A 11/1997 Rose et al.
5,716,720 A 2/1998 Murphy
5,788,823 A 8/1998 Warnes et al.
5,843,588 A 12/1998 Rose et al.
5,856,027 A 1/1999 Murphy
5,897,966 A 4/1999 Grossklaus, Jr. et al.
5,942,337 A 8/1999 Rickerby et al.
5,981,091 A 11/1999 Rickerby et al.
5,989,733 A 11/1999 Warnes et al.
6,291,014 B1 * 9/2001 Warnes et al.
6,435,826 B1 8/2002 Allen et al.
6,435,835 B1 8/2002 Allen et al.

* cited by examiner

*Primary Examiner*—Deborah Jones
*Assistant Examiner*—Jennifer McNeil

(57) ABSTRACT

Method for forming on a superalloy or other metallic substrate a platinum graded, outward single phase diffusion aluminide coating on a surface of the substrate by depositing a layer comprising Pt on the substrate and then gas phase aluminizing the substrate in a coating chamber having a solid source of aluminum (e.g. aluminum alloy particulates) disposed therein close enough to the surface of the substrate to form at an elevated substrate coating temperature a diffusion aluminide coating having an inner diffusion zone and outer additive single (Ni,Pt)Al phase layer having a concentration of platinum that is relatively higher at an outermost coating region than at an innermost coating region adjacent the diffusion zone.

21 Claims, 6 Drawing Sheets

GRADED PLATINUM DIFFUSION ALUMINIDE COATING

FIELD OF THE INVENTION

The present invention relates to forming a platinum modified diffusion aluminide coating on a superalloy component, such as a gas turbine engine blade and vane, exposed to high service temperatures.

BACKGROUND OF THE INVENTION

Advancements in propulsion technologies have required gas turbine engines to operate at higher temperatures. This increase in operating temperature has required concomitant advancements in the operating temperatures of metallic (e.g. nickel and cobalt base superalloy) turbine engine components to withstand oxidation and hot corrosion in service. Inwardly grown and outwardly grown platinum modified diffusion aluminide coatings have been formed on superalloy turbine engine components to meet these higher temperature requirements. One such inwardly grown platinum modified diffusion coating is formed by chemical vapor deposition using aluminide halide coating gas and comprises an inward diffusion zone and an outer two phase [$PtAl_2$+(Ni,Pt)Al] layer. The two phase Pt modified diffusion aluminide coatings are relatively hard and brittle and have been observed to be sensitive to thermal mechanical fatigue (TMF) cracking in gas turbine engine service.

One such outwardly grown platinum modified diffusion coating is formed by chemical vapor deposition using a low activity aluminide halide coating gas as described in U.S. Pat. Nos. 5,658,614; 5,716,720; 5,989,733; and 5,788,823 and comprises an inward diffusion zone and an outer (additive) single phase (Ni,Pt)Al layer.

An object of the present invention is to provide a gas phase aluminizing method using one or more solid sources of aluminum for forming on a substrate surface an outwardly grown, single phase diffusion aluminide coating that includes an outer additive layer having a graded Pt content from an outer toward an inner region thereof.

SUMMARY OF THE INVENTION

The present invention involves forming on a substrate, such as a nickel or cobalt base superalloy substrate, a platinum modified diffusion aluminide coating by depositing a layer comprising platinum on the substrate and then gas phase aluminizing the substrate in a coating chamber having a solid source of aluminum (e.g. aluminum alloy particulates) disposed therein close enough to the substrate surface as to form at an elevated coating temperature an outwardly grown diffusion aluminide coating having an inner diffusion zone and outer, single phase (Ni,Pt)Al additive layer having a concentration of platinum that is relatively higher at an outermost coating region than at an innermost coating region adjacent the diffusion zone. Gas phase aluminizing can be conducted with or without a prediffusion of the platinum layer into the substrate.

The present invention also envisions forming on a substrate a platinum graded, single phase diffusion aluminide coating at a first surface area of the substrate and concurrently a different diffusion aluminide coating at a second surface area of the substrate in the same coating chamber.

The present invention is advantageous to form on a nickel or cobalt base superalloy substrate an outwardly grown platinum modified diffusion aluminide coating having an outer, single phase (Ni,Pt)Al additive layer with a Pt content that is relatively higher at an outermost coating region than at an innermost coating region adjacent to a diffusion zone to impart oxidation and hot corrosion resistance thereto and improved ductility as compared to conventional two phase platinum modified diffusion coatings.

The above objects and advantages of the present invention will become more readily apparent from the following description taken with the following drawings.

DESCRIPTION OF THE INVENTION

An exemplary embodiment of the invention involves forming on a nickel base superalloy, cobalt base superallloy, or other substrate an outwardly grown diffusion aluminide coating characterized by having an inner diffusion zone and outer, additive single phase (Ni,Pt)Al layer having a concentration of platinum that is relatively higher at an outermost coating region than at an innermost coating region adjacent the diffusion zone. The single phase (Ni,Pt)Al layer comprises a platinum modified nickel aluminide where platinum is in solid solution in the aluminide.

The substrate typically comprises a nickel or cobalt base superalloy which may comprise equiaxed, directionally solidified and single crystal castings as well as other forms of these materials, such as forgings, pressed powder components, machined components, and other forms. For example only, the substrate may comprise the PWA 1484 nickel base superalloy having a nominal composition of 10.0% Co, 8.7% Ta, 5.9% W, 5.65% Al, 5.0% Cr, 3.0% Re, 1.9% Mo, 0.10% Hf, and balance Ni (where % is in weight %) used for making single crystal turbine blades and vanes. Other nickel base superalloys which can be used include, but are not limited to, PWA 655, PWA 1422, PWA 1447, PWA 1455, PWA 1480, Rene N-5, Rene N-6, Rene 77, Rene 80, Rene 125, CSMX-4, and CMSX-10 nickel base superalloys.

Cobalt based superalloys which can be used include, but are not limited to, Mar-M-509, Stellite 31, and WI 52 and other cobalt base superalloys.

Figure 1:
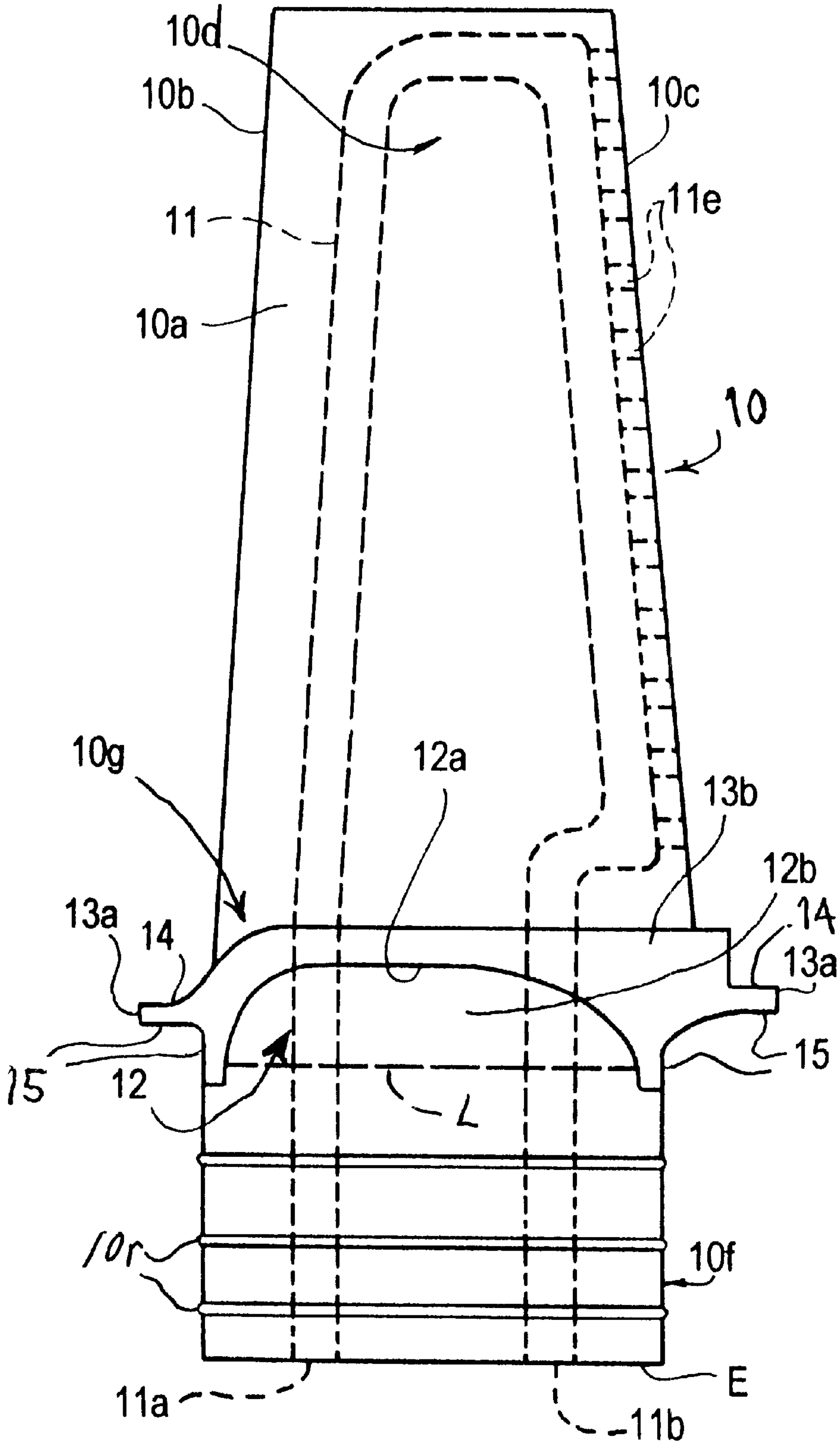
FIG. 1 is an elevational view of a gas turbine engine blade having an airfoil region, a root region and a platform region with a damper pocket or recess beneath the platform region and located on the concave side and convex side of the airfoil.

For purposes of illustration and not limitation, the invention will be described herebelow with respect to forming the outwardly grown, graded platinum modified diffusion aluminide coating on a selected region of a gas turbine blade 10 as illustrated in FIG. 1. The turbine blade comprises the aforementioned PWA 1484 nickel base superalloy. The turbine blade is made as a single crystal investment casting having an airfoil region 10*a* with a leading edge 10*b* and trailing edge 10*c*. The airfoil includes a concave side 10*d* and convex side 10*e*. The turbine blade 10 includes a root region 10*f* and a platform region 10*g* between the root region and airfoil region. The root region can include a plurality of fir-tree ribs 10*r*. The platform region includes a pair of damper pockets or recesses 12 (one shown in FIG. 1) with one damper pocket being located on the platform region at the concave side 10*d* and the other on the platform region at the convex side 10*e* of the airfoil region. Each damper pocket 12 is defined by an overhanging surface 12*a* of the platform region log and a side surface 12*b* thereof that has a surface extent defined by the dashed line L in FIG. 1. Damper pocket surface 12*a* extends generally perpendicular to damper pocket surface 12*b*.

The platform region 10*g* also includes external first and second peripheral end surfaces 13*a* at the respective leading and trailing edges, first and second peripheral side surfaces 13*b* disposed at the concave and convex sides, upwardly facing surfaces 14 that face toward the airfoil region 10*a*, and outwardly facing surfaces 15 that face toward and away from the root region 10*f*.

The turbine blade 10 includes an internal cooling passage 11 illustrated schematically having cooling air inlet openings 11*a*, 11*b* at the end E of the root region 10*f*. The internal cooling passage 11 extends from the inlet openings 11*a*, 11*b* through root region 10*f* and through the airfoil region 10*a*, the configuration of the passage 11 being simplfied for covennience. In the airfoil region, the cooling passage 11 communicates to a plurality of exit openings lie at the trailing edge 10*c* where cooling air is discharged.

The exemplary turbine blade 10 described above is coated externally and internally with a protective outward diffusion aluminide coating in order to withstand oxidation and hot corrosion in service in the turbine section of the gas turbine engine.

In a particular embodiment offered for purposes of illustration and not limitation, the damper pocket surfaces 12*a*, 12*b* are gas phase aluminized pursuant to the invention to form an outwardly grown, platinum graded single phase diffusion aluminide coating of the invention locally on surfaces 12*a*, 12*b*, while an outwardly grown, Pt-free nickel aluminide diffusion coating is formed on the external surfaces of airfoil region 10*a* and the surfaces 13*a*, 13*b*, 14 of platform region log. The root region 10*f* and surfaces 15 of the platform region 10*g* are uncoated. The surfaces of the internal cooling passage 11 are coated to form a Pt-free outward diffusion aluminide coating.

For purposes of illustration and not limitation, the following steps are involved in coating the turbine blade 10 with the coatings described above. In particular, the investment cast turbine blades 10 are each subjected to multiple abrasive blasting operations where the damper pocket surfaces 12*a*, 12*b* are blasted with 240 mesh aluminum oxide grit at 10 to 40 psi with a 3 to 7 inch grit blast nozzle standoff distance.

In preparation for electroplating of platinum on the damper pocket surfaces 12*a*, 12*b*, the external surfaces of each turbine blade 10, other than damper pocket surfaces 12*a*, 12*b*, are masked by a conventional peel type of maskant, while the internal cooling passage 11 is filled with wax.

Each masked turbine blade then is subjected to an electroplating operation to deposit a platinum layer on the damper pocket surfaces 12*a*, 12*b* only. For purposes of illustration only, a useful electroplating solution comprised of a conventional aqueous phosphate buffer solution including hexachloroplatinic acid (Pt concentation of 1 to 12 grams per liter, pH of 6.5 to 7.5, specific gravity of 16.5 to 21.0 Baume', electrolyte temperature of 160 to 170 degrees F.) and a current density comprised 0.243–0.485 amperes/inch$^2$ to deposit a platinum layer. A suitable platinum plating solution including hexachloroplatinic acid is described in U.S. Pat. Nos. 3,677,789 and 3,819,338. A hydroxide based aqueous plating solution is described in U.S. Pat. No. 5,788,823. The platinum layer can be deposited in an amount of 0.109 to 0.153 grams/inch$^2$, typically 0.131 grams/inch$^2$, on damper pocket surfaces 12*a*, 12*b*. These electroplating parameters are offered merely for purposes of illustration as other platinum electroplating solutions and parameters can be employed. The platinum layer also can be deposited on surfaces 12*a*, 12*b* by techniques other than electroplating, such as including, but not limited to sputtering and other deposition techniques.

After plating, the maskant and the wax in internal passage 11 are removed from each turbine blade. The maskant and wax can be removed by heating the blades to 1250 degrees F. in air. The blades then are high pressure spray washed internally in deionized water followed by washing in a washer available from Man-Gill Chemical Company, Magnus Division, which is operated at medium stroke for 15 to 30 minutes at 160 to 210 degrees F. water temperature. The turbine blades then are dried for 30 minutes at 225 to 275 degrees F.

After cleaning as described above, the turbine blades 10 can be subjected to an optional prediffusion heat treatment to diffuse the platinum layer into the superalloy substrate at the electroplated damper pocket surfaces 12*a*, 12*b*. In particular, the turbine blades can be heated in a flowing argon atmosphere in a retort to 1925 degrees F. for 5 to 10 minutes. At the end of the prediffusion heat treat cycle, the turbine blades are fan cooled from 1925 degrees F. to 1600 degrees F. at 10 degrees F./minute or faster to below 900 degrees F. under argon atmosphere. The turbine blades then are removed from the retort. The airfoil region 10*a* and platform region 10*g* are then subjected to abrasive blasting using 240 mesh aluminum oxide grit at 40 to 60 psi with a 3 to 5 inch grit blast nozzle standoff distance. The root region 10*f* and damper pocket surfaces 12*a*, 12*b* are shielded and not grit blasted. The prediffusion heat treatment can be optional in practicing the invention such that the turbine blades with as-electroplated damper pocket surfaces 12*a*, 12*b* can be gas phase aluminized directly without the prediffusion heat treatment.

Figure 3:
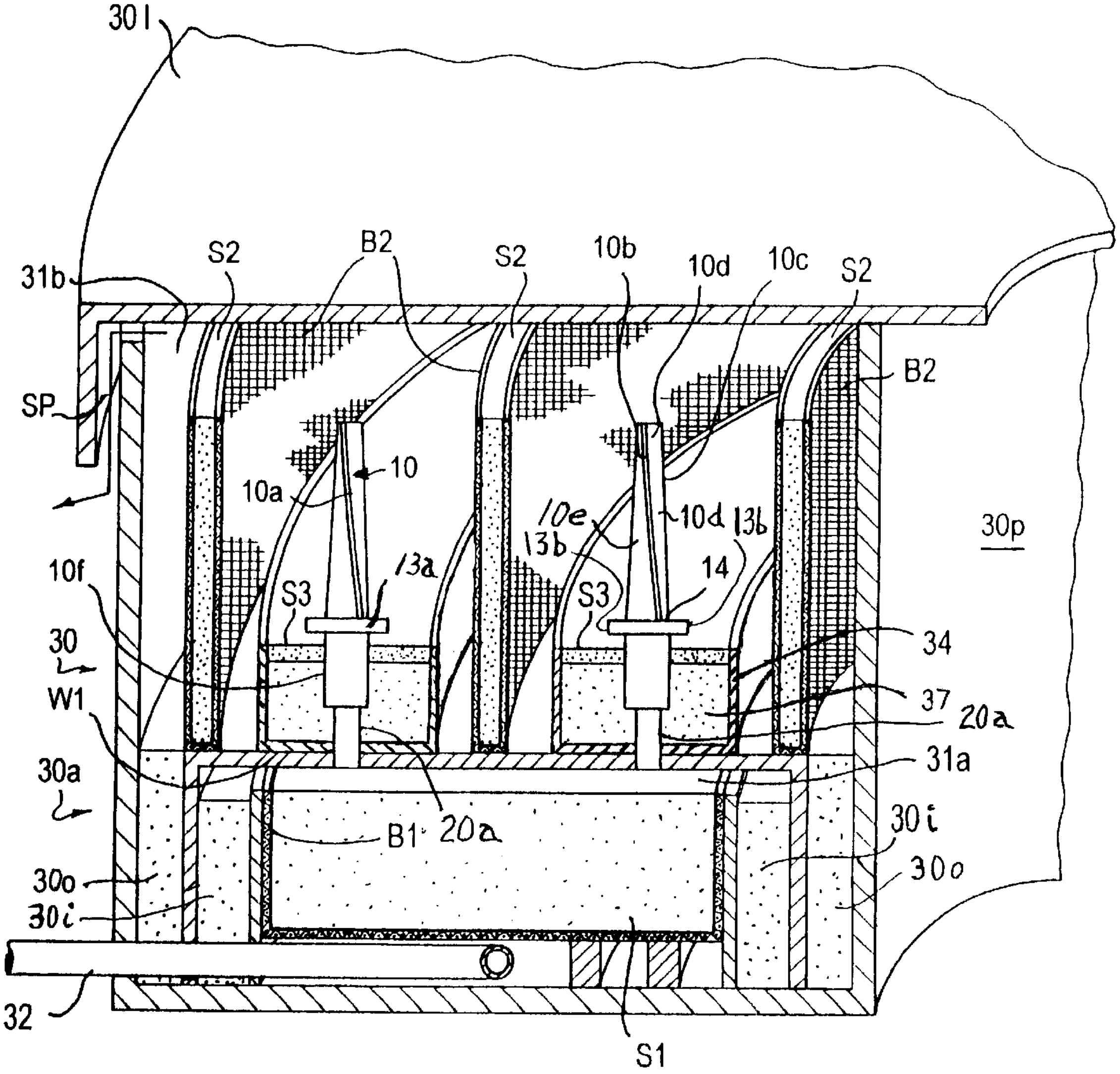
FIG. 3 is a partial schematic view of a coating chamber in which the turbine blades are coated. The coating chamber comprises a cylindrical annular chamber with a lid and having a central passage to receive a lifting post as illustrated in FIG. 4.
Figure 4:
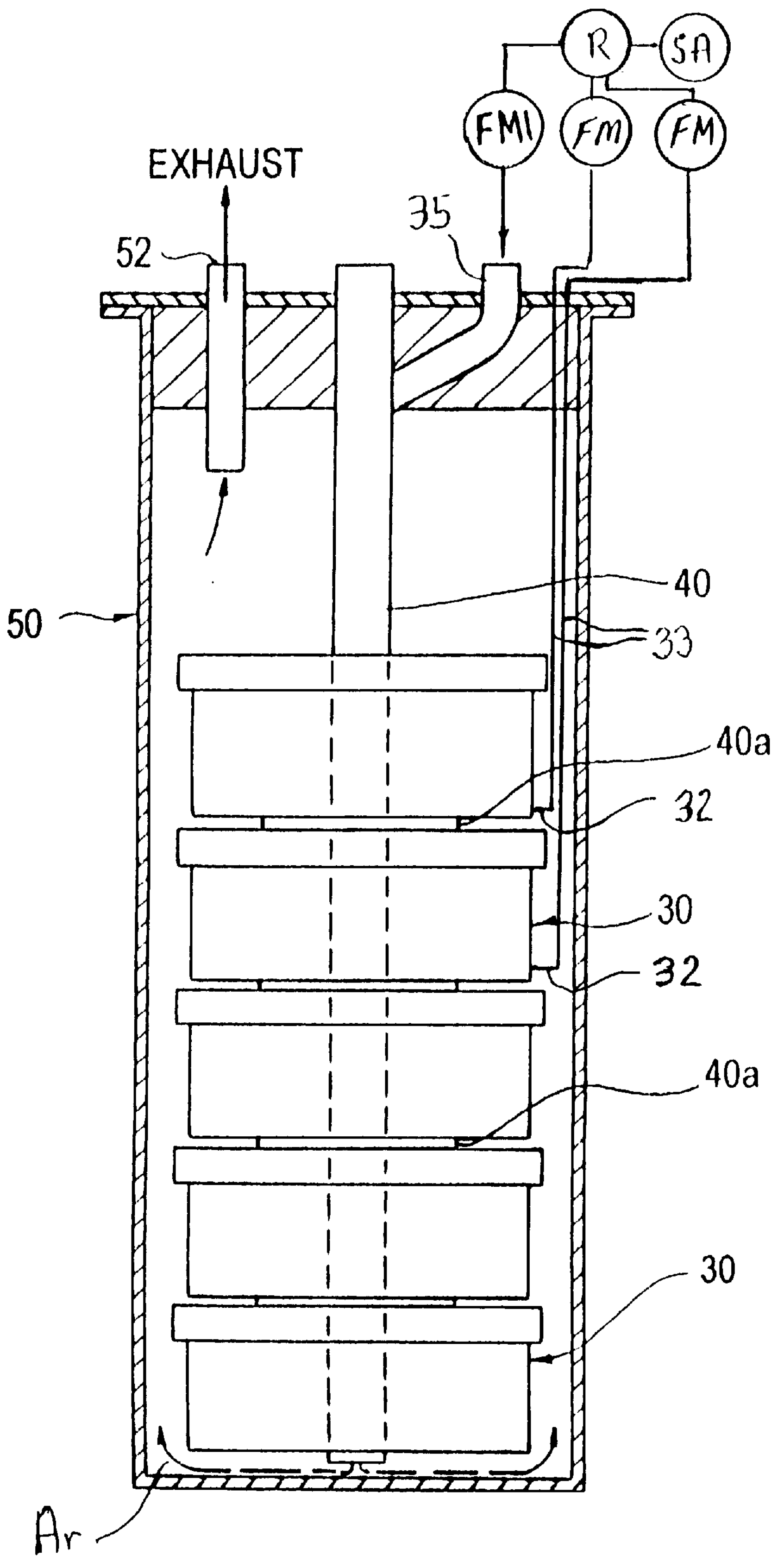
FIG. 4 is a schematic sectional view of the retort showing a plurality of coating chambers positioned therein on a lifting post.

The turbine blades 10 with or without the prediffusion heat treatment then are subjected to a gas phase aluminizing operation pursuant to the invention in a coating chamber, FIG. 3, disposed in a coating retort, FIG. 4.

Figure 2:
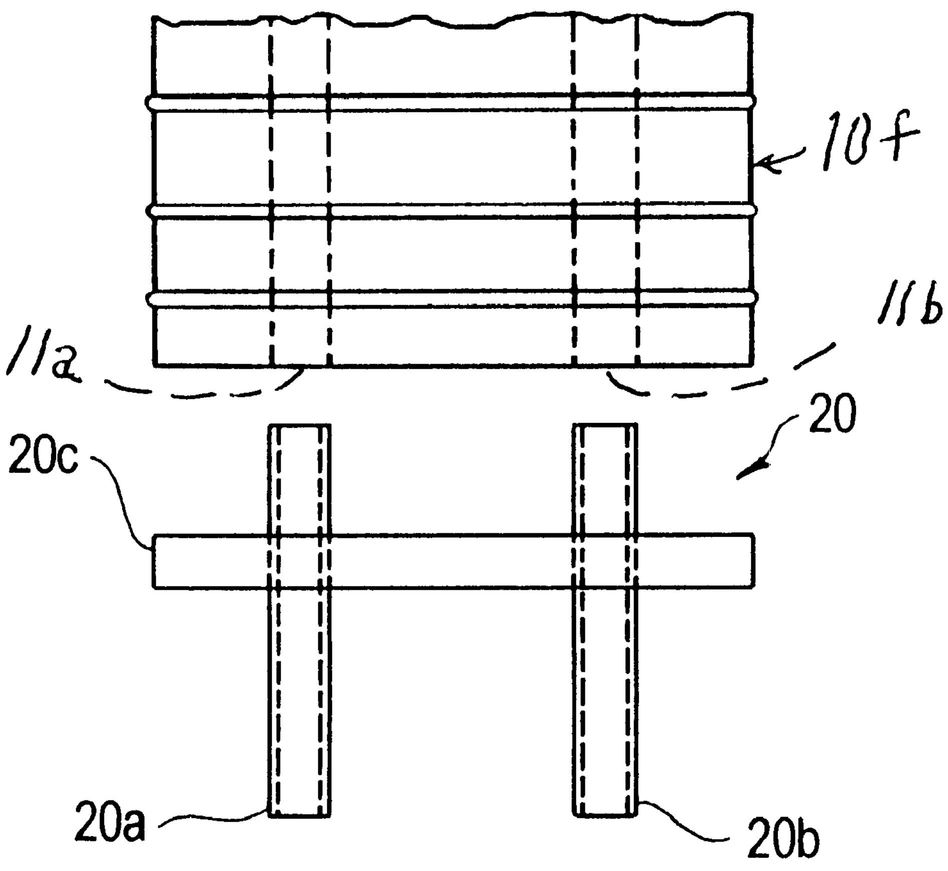
FIG. 2 is an elevational view of a pin fixture to be positioned in the root end of a turbine blade for conducting coating gas through internal cooling passages of the turbine blade.

Prior to gas phase aluminizing, a pin fixture 20 comprising an hollow pins 20*a* and 20*b* on a base plate 20*c* is adhered to the end E of the root region 10*f*. The pins 20*a*, 20*b* extend into and communicate to the respective openings 11*a*, 11*b* of the internal passage 11 at the root end, FIG. 2.

Maskant then is applied to root region 10*f* and surfaces 15 in FIG. 1. The maskant can comprise multiple layers of conventional M-1 maskant (stop-off comprising alumina in a binder) and M-7 maskant (sheath coat comprising mostly nickel powder in a binder), both maskants being available from Alloy Surfaces Co., Inc., Wilmington, Del. For example, 2 coats of M-1 maskant and 4 coats of M-7 maskant can be applied to the above surfaces. These maskants are described only for purposes of illustration and not limitation as any other suitable maskant, such as a dry maskant, can be used.

For purposes of illustration and not limitation, gas phase aluminizing of the turbine blades to form the coatings described above is conducted in a plurality of coating chambers 30, FIGS. 3 and 4, carried on supports 40*a* on lifting post 40 positioned in coating retort 50. Each coating chamber 30 comprises a cylindrical, annular chamber 30*a* and a lid 30*l*, the chamber and lid having a central passage 30*p* to receive lifting post 40 as illustrated in FIG. 4.

Each coating chamber includes therein a lower chamber region 31*a* and upper coating chamber region 31*b*. A plurality of turbine blades 10 are held root-down in cofferdams 34 in upper chamber region 31*b* with the hollow pins 20*a*, 20*b* adhered on the root ends extending through respective pairs of holes in the bottom walls of the cofferdams 34 and wall W1 so as to communicate the hollow pins 20*a*, 20*b* to lower chamber 31*a*. In FIG. 3, each pin 20*b* and the corresponding holes in each cofferdam 34 and wall W1 are hidden behind pin 20*a*. The root regions 10*f* of a plurality of blades 10 are held in beds 37 of alumina (or other refractory) particulates in annular cofferdams 34, FIG. 3. Although only one blade 10 is shown so held in each cofferdam 34 for sake of convenience, the root regions 10*f* of a plurality of blades 10 typically are so held circumferentially spaced apart in each cofferdam 34. The root regions 10*f* are placed in each cofferdam 34 with the respective pins 20*a*, 20*b* communicated to the lower chamber region 31*a* and the alumina particulates of bed 37 then are introduced into the cofferdams 34 to embed the root regions 10*f* in the alumina particulates to an extent shown in FIG. 3*a*. Inner and outer gas seals 30*i*, 30*o* are formed between the lower chamber region 31*a* and upper chamber region 31*b* by alumina grit filled and packed in the spaces between the annular chamber walls as illustrated in FIG. 3.

The lower chamber region 31*a* includes a solid source S1 of aluminum (e.g. aluminum alloy particles) received in annular open wire basket B1 to generate at the elevated coating temperature to be employed (e.g. 1975 degrees F. plus or minus 25 degrees F.) aluminum-bearing coating gas to form the diffusion aluminide coating on the interior surfaces of the cooling passage 11 of each turbine blade. An amount of a conventional halide activator (not shown), such as for example only $AlF_3$, is used to initiate generation of the aluminum-bearing coating gas (e.g. AlF gas) from solid source S1 at the elevated coating temperature to be employed. An argon (or other carrier gas) ring-shaped inlet conduit 32 is positioned in the lower chamber region 31*a* to discharge argon carrier gas that carries the generated aluminum-bearing coating gas through the pins 20*a*, 20*b* and the cooling passage 11 for discharge from the exit openings 11*e* at the trailing edge of the turbine blades. Each conduit 32 is connected to a conventional common source SA of argon (Ar) as shown in FIG. 4 for the two topmost chambers 30 by individual piping 33 extending through the retort lid to a fitting (not shown) on each conduit 32. Each piping 33 is connected to a common pressure regulator R and a respective individual flowmeter FM outside the retort to control argon pressure and flow rate. For sake of convenience, the argon source SA, pressure regulator R, flowmeter FM, and piping 33 are shown only for the two topmost coating chambers 30 in the retort 50. Each conduit 32 of each of the other coating chambers 30 is connected in similar fashion to the common argon source SA and the common regulator R by its own piping (not shown).

The aluminum activity in the solid source S1 (i.e. the activity of aluminum in the binary aluminum alloy particles S1) is controlled to form the desired type of diffusion aluminide coating on interior cooling passage surfaces at the elevated coating temperature. The aluminum activity in source S1 is controlled by selection of a particular aluminum alloy particle composition effective to form the desired type of coating at the particular coating temperature involved. For purposes of illustration and not limitation, to form the above described outward type of diffusion aluminide coating on the interior cooling passage surfaces, the source S1 can comprise Co-Al binary alloy particulates with the particulates comprising, for example, 50 weight % Co and balance Al. The particulates can have a particle size of 4 mm by 16 mm (mm is millimeters). The activator can comprise $AlF_3$ powder sprinkled beneath each basket B1. During transport through the cooling passage 11 by the argon carrier gas, the aluminum-bearing coating gas will form the outward diffusion aluminide coating on the interior cooling passage surfaces.

For purposes of illustration and not limitation, to internally coat up to 36 turbine blades in each coating chamber 30 to form the above outward aluminide diffusion coating in internal passage 11, about 600 grams of $AlF_3$ powder activator can be sprinkled in each lower chamber region 31*a* beneath each basket B1 and 60–75 pounds of Co-Al alloy particulates placed in each basket B1 in each lower chamber region 31*a*. The outward diffusion aluminide coating so formed on internal passage walls has a microstructure comprising an inner diffusion zone and a single NiAl phase outer additive layer and has a total thickness in the range of 0.0005 to 0.003 inch for purposes of illustration.

The upper chamber region 31*b* includes a plurality (three shown) of solid sources S2 of aluminum received in three respective annular open wire baskets B2 on horizontal chamber wall W1 with aluminum activity of sources S2 controlled by the binary alloy composition to form the desired diffusion aluminide coating on the exterior surfaces of the airfoil region 10*a* and on platform surfaces 13*a*, 13*b* and 14. A conventional halide activator (not shown), such as for example only, aluminum fluoride ($AlF_3$) powder, is sprinkled beneath the baskets B2 on wall W1 in an amount to initiate generation of aluminum-bearing coating gas (e.g. AlF gas) from solid sources S2 in upper chamber region 31*b* at the elevated coating temperature (e.g. 1975 degrees F. plus or minus 25 degrees F.) to be employed. For purposes of illustration and not limitation, to form the above outwardly grown, Pt-free nickel aluminide diffusion coating on the exterior surfaces of the airfoil region 10*a* and platform surfaces 13*a*, 13*b* and 14, the sources S2 can comprise a Cr-Al binary alloy particulates with the particles comprising for example, 70 weight % Cr and balance Al. The particulates can have a particle size of 4 mm by 16 mm. The activator can comprise $AlF_3$ powder. To coat 36 turbine blades in each coating chamber to form the above outwardly grown, Pt-free nickel aluminide diffusion coating, about 35 grams of $AlF_3$ is sprinkled beneath baskets B2 on the wall W1 of each coating chamber and 140 to 160 pounds of Cr-Al alloy particulates are placed in each basket B2 in each upper chamber region 31*b*. The outwardly grown, Pt-free nickel aluminide diffusion coating includes an inner diffusion zone proximate the substrate and an outer, Pt-free additive single phase NiAl layer and typically has a total thickness in the range of 0.001 to 0.003 inch.

Pursuant to an embodiment of the invention, the upper chamber region 31*b* also includes solid sources S3 of aluminum (e.g. binary aluminum alloy particles) disposed in the annular cofferdams 34. The solid sources S3 have a predetermined aluminum activity in the solid sources S3 and are in close enough proximity to the damper pocket surfaces 12*a*, 12*b* to form thereon a diffusion aluminide coating 100, FIG. 5, different from that formed on the surfaces of airfoil region 10*a* and platform surfaces 13*a*, 13*b* and 14 at the elevated coating temperature. The activity of aluminum in the sources S3 is controlled by selection of a particular binary aluminum alloy particle composition effective to form the desired type of coating at the particular coating temperature involved.

Figure 5:
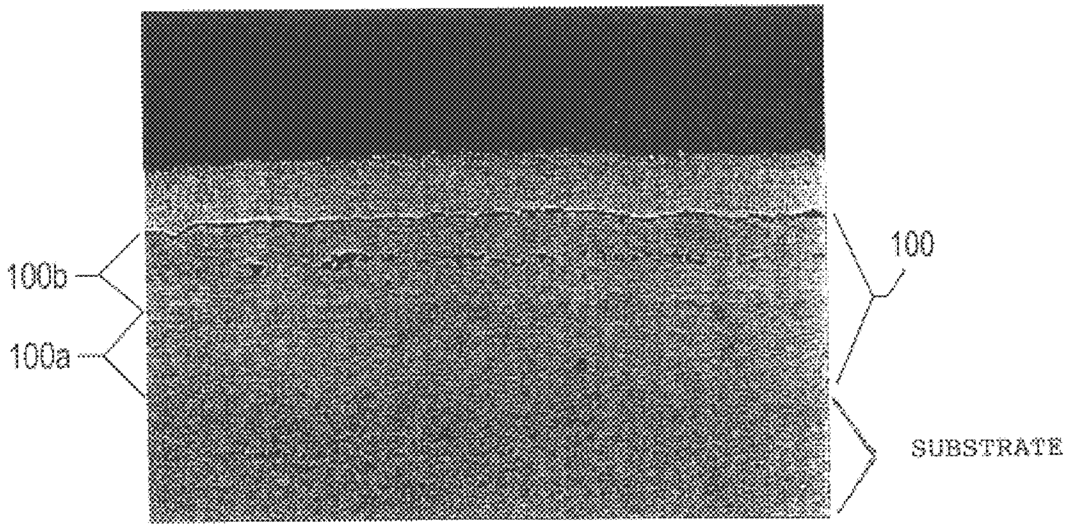
FIG. 5 is a photomicrograph at 475 X of an outwardly grown diffusion aluminide coating having an inner diffusion zone and outer single phase additive layer having a concentration of platinum that is relatively higher at an outermost coating region than at an innermost coating region adjacent the diffusion zone. The topmost layer of FIG. 5 is not part of the coating and is present only to make the metallographic sample.

In particular, the diffusion aluminide coating 100 formed only on damper pocket surfaces 12*a*, 12*b* includes an inner diffusion zone 100*a* and outer, additive Pt-bearing single phase (Ni,Pt)Al layer 100*b*, FIG. 5, having a concentration of platinum that is relatively higher at an outermost coating region (e.g. outer 20% of the additive layer thickness) than at an innermost coating region adjacent the diffusion zone 100*a*. This is in contrast to the above outwardly grown, Pt-free diffusion aluminide coating formed on the surfaces of airfoil region 10*a* and platform surfaces 13*a*, 13*b* and 14 to have an outer, additive single phase NiAl layer that is devoid of platinum. The coating 100 typically has a total thickness (layer 100*a* plus 100*b*) in the range of 0.001 to 0.003 inch, typically 0.002 inch.

For purposes of illustration and not limitation, the solid sources S3 can comprise the same aluminum alloy particulates as used in beds S2 (i.e. 70 weight % Cr and balance Al particles of 4 mm by 16 mm particle size) but positioned within a close enough distance D to the lowermost extent of damper pocket surface 12*a* delineated by the dashed line in FIG. 1 to provide, at the elevated coating temperature, a higher aluminum species activity in the aluminum-bearing coating gas proximate the damper pocket surfaces 12*a*, 12*b* than is provided at the surfaces of the airfoil region 10*a* and upwardly facing surfaces of the platform region 10*g* by the solid sources S2 as a result of their being more remotely spaced from the airfoil surfaces and platform surfaces.

Figure 3A:
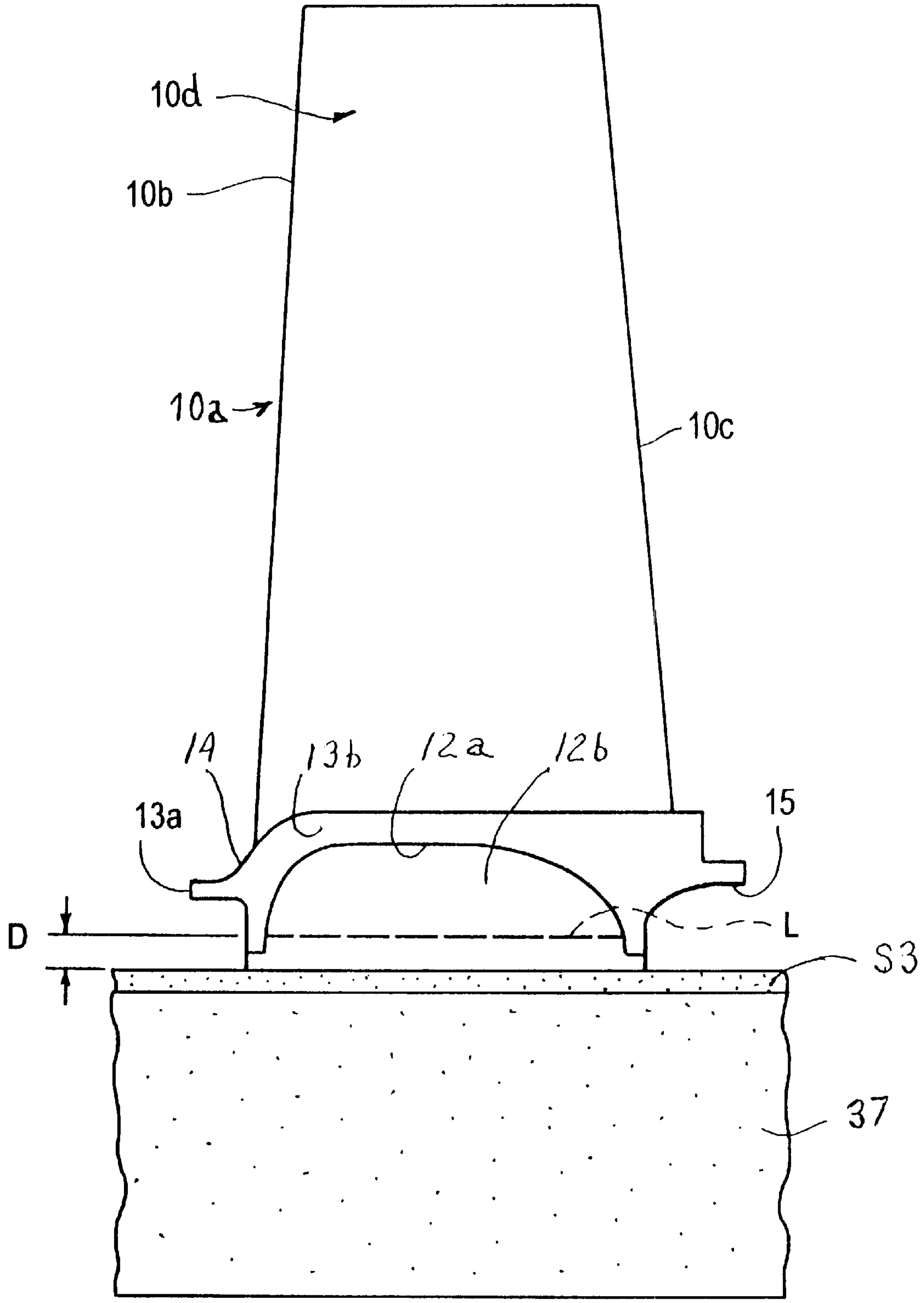
FIG. 3*a* is partial enlarged elevational view of the turbine blade with the damper pocket proximate a source of aluminum.

For purposes of illustration only, to coat 36 turbine blades in each coating chamber 30, 5 to 10 pounds of the Cr-Al alloy particulates (70 weight % Cr and balance Al) are placed in each cofferdam 34 with the upper surface of the source S3 positioned within a close enough distance D, FIG. 3*a*, of from ⅜ to ½ inch to the lowermost extent of damper pocket surface 12*a* defined by the dashed line L to form the above graded platinum concentration (Pt gradient) through the thickness of the outer additive layer 100*b*. On the other hand, the sources S2 typically are spaced a distance of about 1.00 inch at their closest distance to the surfaces of the airfoil region 10*a* and platform surfaces 13*a*, 13*b* and 14.

The solid sources S3 alternately can comprise aluminum alloy particulate having a different composition from that of solid sources S2. The composition (i.e. activity) of the solid sources S3 and their distance from the damper pocket surfaces 12*a*, 12*b* can be adjusted empirically so as to form the above graded platinum concentration through the thickness of the outer additive layer 100*b*.

Gas phase aluminizing is effected by loading the coating chambers 30 having the turbine blades 10 and sources S1, S2, S3 therein on the supports 40*a* on lifting post 40 and placing the loaded post in the retort 50, FIG. 4, for heating to an elevated coating temperature (e.g. 1975 degrees F. plus or minus 25 degrees F.) in a heating furnace (not shown). The elevated coating temperature can be selected as desired in dependence upon the compositions of solid aluminum sources S1, S2, S3, the composition of the substrates being coated and coating gas composition. The coating temperature of 1975 degrees F. plus or minus 25 degrees F. is offered only for purposes of illustration with respect to coating the PWA 1484 nickel base superalloy turbine blades described above using the sources S1, S2, S3 and activators described above.

During gas phase aluminizing in the coating chambers 30 in the retort 50, the solid source S1 in the lower chamber region 31*a* generates aluminum-bearing coating gas (e.g. AlF gas) which is carried by the carrier gas (e.g. argon) supplied by piping 33 and conduits 32 for flow through the internal cooling passage 11 of each turbine blade to form the outward diffusion aluminide coating on the interior cooling passage surfaces. The spent coating gas is discharged from the exit openings 11*e* at the trailing edge of each turbine blade and flows out of a space SP between the coating chamber 30*a* and loose lid 30*l* thereon into the retort 50 from which it is exhausted through exhaust pipe 52.

The aluminum-bearing coating gas generated from sources S2, S3 in the upper chamber region 31*b* forms the different diffusion aluminide coatings described above on the damper pocket surfaces 12*a*, 12*b* and the exterior surfaces of the airfoil region 10*a* and platform surfaces 13*a*, 13*b* and 14. The coating gases from sources S2, S3 are carried by the argon flow from gas discharge openings lie out of chamber 31*b* through space SP into the retort 50 from which it is exhausted via pipe 52.

For forming the different internal and external aluminide diffusion coatings described in detail above on the PWA 1484 alloy turbine blades 10, the coating chambers 30 and retort 50 initially are purged of air using argon flow. During gas phase aluminizing, a coating chamber argon flow rate typically can be 94 cfh (cubic feet per hour) plus or minus 6 cfh at 30 psi Ar plus or minus 2.5 psi. The retort argon flow is provided by the common argon source SA and the common pressure regulator R connected to piping 35 that extends through the retort lid behind the post 40 in FIG. 4 to the bottom of the retort where the argon is discharged from the piping 35. Piping 35 is connected to a flowmeter FM1 downstream of the common regulator R to control argon pressure and flow rate. A retort argon flow rate typically can be 100 cfh Ar plus or minus 6 cfh at 12.5 psi plus or minus 2.5.

The elevated coating temperature can be 1975 degrees plus or minus 25 degrees F. and coating time can be 5 hours plus or minus 15 minutes. The elevated coating temperature is controlled by adjustment of the heating furnace temperature in which the retort 50 is received. The heating furnace can comprise a conventional gas fired type of furnace or an electrical resistance heated furnace. After coating time has elapsed, the retort is removed from the heating furnace and fan cooled to below 400 degrees F. while maintaining the argon atmosphere.

The coated turbine blades then can be removed from the coating chambers 30, demasked to remove the M-1 and M-7 maskant layers, grit blasted with 240 mesh alumina at 15–20 psi with a 5 to 7 inch nozzle standoff distance, and washed as described above to clean the turbine blades. The coated turbine blades then can be subjected to a diffusion heat treatment (1975 degrees F. plus or minus 25 degrees F. for 4 hours), precipitation hardening heat treatment (1600 degrees F. plus or minus 25 degrees F. for 8 hours followed by fan cool from 1600 degrees F. to 1200 degrees F. at 10 degrees F./minute or faster to below 900 degrees F.) , abrasive blasting using 240 mesh alumina grit at 15 to 20 psi with a 5 to 7 grit blast nozzle standoff distance, then conventionally heat tint inspected to evaluate surface coverage by the diffusion aluminide coating, which heat tint inspection forms no part of the present invention.

FIG. 5 illustrates a typical diffusion aluminide coating 100 formed on damper pocket surfaces 12*a*, 12*b* as including inner diffusion zone 100*a* and outer, additive single phase (Ni,Pt)Al layer 100*b* having a concentration of platinum that is relatively higher at an outermost coating region (e.g. outer 20% of the additive layer thickness) than at an innermost coating region adjacent the diffusion zone 100*a*. For example, the outer additive (Ni,Pt)Al layer typically will have a Pt concentration of 25 to 45 weight % and possibly up to 60 weight % in the outer 20% of the outer additive layer 100*b* and an Al concentration of 20 to 30 weight % and possibly up to 35 weight % in the outer 20% of the outer additive layer 100*b*. In contrast, the outer, additive (Ni,Pt)Al layer typically will have a Pt concentration of 10 to 25 weight % in the inner 20% of the outer additive layer 100*b* adjacent the diffusion zone 100*a* and an Al concentration of 20 to 25 weight % in the inner 20% of the outer additive layer 100*b* adjacent the diffusion zone 100*a*. The black regions in the additive layer 100*b* in FIG. 5 are oxide and/or grit particles present at the original substrate surface.

The Table below illustrates contents of elements at selected individual areas of the outer, additive single phase (Ni,Pt)Al layer 100*b* formed on damper pocket surfaces of PWA 1484 turbine blades. The compositions were measured at different depths (in microns) from the outermost surface of the outer additive layer 100*b* toward the diffusion zone by energy dispersive X-ray spectroscopy. The samples were measured before the diffusion and precipitation hardening heat treatments. The area designations I2, I3 indicate samples coated in the inner basket of FIG. 3. Microns is the depth from the outermost surface of the additive layer 100*b*.

TABLE I

| SAMPLE/AREA/DISTANCE FROM SURFACE, MICRONS | ELEMENTAL COMPOSITION (WEIGHT %) Al | Cr | Co | Ni | Pt |
|---|---|---|---|---|---|
| 1-I2-2 | 28.7 | 4.3 | 1.9 | 31.8 | 33.4 |
| 5 | 30.5 | 3.2 | 2.7 | 29.3 | 34.3 |
| 8 | 27.5 | 5.8 | 2.1 | 23.8 | 40.7 |
| 11 | 31.8 | 1.7 | 4.9 | 45.5 | 16.1 |
| 14 | 31.1 | 1.3 | 6.9 | 47.3 | 13.4 |
| 17 | 24.5 | 12.3 | 7.9 | 48.2 | 7.1 |
| 20 | 19.1 | 14.4 | 8.9 | 50.0 | 7.6 |
| 23 | 8.7 | 30.5 | 6.6 | 50.7 | 3.8 |
| 1-I3-2 | 26.9 | 2.1 | 1.0 | 28.4 | 41.6 |
| 5 | 26.7 | 2.2 | 1.8 | 26.3 | 43.1 |
| 8 | 28.5 | 1.7 | 2.5 | 34.1 | 33.2 |
| 11 | 27.1 | 1.6 | 3.3 | 35.4 | 32.6 |
| 14 | 24.1 | 2.7 | 5.3 | 41.3 | 26.6 |
| 17 | 16.6 | 16.9 | 4.8 | 36.5 | 25.1 |
| 20 | 11.3 | 27.5 | 8.7 | 34.9 | 17.7 |
| 23 | 6.1 | 41.9 | 11.6 | 29.8 | 10.6 |

The Table reveals a distinct Pt gradient in the outer, additive layer 100*b* from the outermost surface thereof toward the diffusion zone 100*a* in the as-aluminized condition. Gradients of Al, Cr, Co and Ni are also evident.

The present invention is advantageous to provide an outwardly grown platinum modified diffusion aluminide coating having a single phase additive outer layer with a Pt content that is relatively higher at an outermost coating region than at an innermost coating region adjacent a diffusion zone to impart oxidation and hot corrosion resistance thereto and improved ductility as compared to conventional two phase platinum modified diffusion coatings.

Although the invention has been described in detail above with respect to forming the outwardly grown platinum modified diffusion aluminide coating having the outer, graded Pt single phase additive outer layer, FIG. 5, only on the damper pocket surfaces 12*a*, 12*b*, the invention is not so limited.

Such outwardly grown, graded platinum modified diffusion aluminide coating can be formed at other regions of turbine blades and vanes (referred to as airfoils). For example, some or all of the exterior surfaces of the airfoil region 10*a* and/or platform region 10*g* can be coated pursuant to the invention to form the outwardly grown, graded platinum modified diffusion aluminide coating, FIG. 5, thereon. To coat the entire airfoil region 10*a*, the airfoil region would be platinum electroplated as described above and the distance of the airfoil region to the aluminum sources S2 would be reduced to form the outwardly grown, graded platinum modified diffusion aluminide coating of FIG. 5 thereon.

Although the invention has been described in detail above with respect to certain embodiments, those skilled in the art will appreciate that modifications, changes and the like can be made therein without departing from the spirit and scope of the invention as set forth in the appended claims.

We claim:

1. A method of forming a platinum modified diffusion aluminide coating on a substrate, comprising depositing a layer comprising platinum on the substrate, disposing the substrate in a coating chamber having a solid source comprising aluminum therein, wherein said substrate and said solid source are disposed so proximate one another as to form on said substrate at an elevated coating temperature an outwardly grown diffusion aluminide coating including an inner diffusion zone and additive layer on said inner diffusion zone, said additive layer having a single phase with a concentration of platinum that is relatively higher at an outermost region than at an innermost region thereof adjacent said diffusion zone, and heating said substrate and said solid source to said coating temperature to form said diffusion aluminide coating on said substrate.

2. The method of claim 1 wherein said coating is formed without a prediffusion of said layer before said heating.

3. The method of claim 1 wherein said coating is formed with a prediffusion of said layer at least partially into said substrate before said heating.

4. The method of claim 1 wherein said solid source of aluminum comprises an alloy of aluminum wit another metal and is positioned close enough to said substrate t form said coating at said coating temperature.

5. The method of claim 4 wherein said solid source comprises a binary aluminum alloy particulate bed disposed in said coating chamber.

6. The method of claim 4 including providing a halide activator in said coating chamber.

7. The method of claim 1 wherein said additive layer comprises (Ni,Pt)Al single phase.

8. A substrate comprising a nickel base superalloy having an outwardly grown diffusion aluminide coating formed on at least a surface area thereof by the method of claim 1 to include said inner diffusion zone and said additive layer having in said single phase said concentration of platinum that is relatively higher at said outermost region than at said innermost region thereof adjacent said diffusion zone.

9. A method of forming different diffusion aluminide coatings on a substrate, comprising depositing a layer comprising Pt on a first surface area of the substrate and not on a second surface area of the substrate, positioning the substrate in a coating chamber with said first surface area thereof relatively proximate to a first solid source comprising aluminum and with said second surface area relatively remote from said first solid source and relatively proximate to a second solid source comprising aluminum, and gas phase aluminizing the substrate by heating the substrate, first solid source, and second solid source to an elevated coating temperature to form on said first surface area a platinum-bearing diffusion aluminide coating having an inner diffusion zone and additive layer on said inner diffusion zone, said additive layer comprising a single phase having a concentration of platinum that is relatively higher at an outermost region than at an innermost region thereof adjacent said diffusion zone, and to form a platinum-free diffusion aluminide coating on said second surface area of said substrate.

10. The method of claim 9 wherein said gas phase aluminizing is conducted without a prediffusion of said layer.

11. The method of claim 9 wherein said gas phase aluminizing is conducted with a prediffusion of said layer at least partially into said substrate.

12. The method of claim 9 wherein said first solid source comprises an alloy of aluminum with another metal and is positioned close enough to said first surface area to form said platinum-bearing diffusion aluminide coating at said coating temperature.

13. The method of claim 12 wherein said first solid source comprises a binary aluminum alloy particulate bed disposed in said coating chamber proximate said first surface area.

14. The method of claim 13 wherein said second solid source comprises a binary aluminum alloy particulate bed disposed in said coating chamber relatively remote from said first surface area and relatively proximate said second surface area.

15. The method of claim 9 including providing a halide activator in said coating chamber.

16. The method of claim 9 wherein said different diffusion aluminide comprises an inner diffusion zone and outer additive NiAl layer free of platinum.

17. The method of claim 9 wherein said first surface area comprises surfaces forming a damper pocket of a gas turbine engine blade.

18. The method of claim 17 wherein said second surface area comprises an airfoil of a gas turbine engine blade.

19. A substrate comprising a nickel base superalloy coated by the method of claim 9 to have said platinum-bearing diffusion aluminide coating formed on said first surface area and said platinum-free diffusion aluminide coating formed on said second surface area.

20. The method of claim 1 wherein an outer 20% of the thickness of said additive layer has a platinum concentration of 25 weight % to 60 weight & Pt.

21. The method of claim 20 wherein said other 20% of the thickness of said additive layer has a platinum concentration of 25 weight % to 45 weight % Pt.

* * * * *

UNITED STATES PATENT AND TRADEMARK OFFICE

CERTIFICATE OF CORRECTION

PATENT NO. : 6,589,668 B1
DATED : July 8, 2003
INVENTOR(S) : Dwayne A. Braithwaite et al.

It is certified that error appears in the above-identified patent and that said Letters Patent is hereby corrected as shown below:

Column 10,
Line 58, replace “wit” with -- with --.
Line 59, replace “t” with -- to --.

Column 12,
Line 31, replace “&” with -- % --.

Signed and Sealed this

Twenty-eighth Day of October, 2003

JAMES E. ROGAN
*Director of the United States Patent and Trademark Office*